US011448226B2

(12) United States Patent
Huang (10) Patent No.: US 11,448,226 B2
(45) Date of Patent: Sep. 20, 2022

(54) FAN HAVING ROTATION SENSING

(71) Applicant: ASIA VITAL COMPONENTS CO., LTD., New Taipei (TW)

(72) Inventor: Po-Sheng Huang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 542 days.

(21) Appl. No.: 16/531,133

(22) Filed: Aug. 5, 2019

(65) Prior Publication Data
US 2021/0040954 A1 Feb. 11, 2021

(51) Int. Cl.
*F04D 27/00* (2006.01)
*H02K 5/04* (2006.01)
(Continued)

(52) U.S. Cl.
CPC ......... *F04D 27/007* (2013.01); *F04D 27/004* (2013.01); *F04D 29/522* (2013.01); *G05B 19/042* (2013.01); *H02K 5/04* (2013.01); *H02K 7/14* (2013.01); *H02K 11/21* (2016.01); *H02K 11/30* (2016.01); *H02K 21/22* (2013.01); *H05K 1/181* (2013.01); *H05K 7/20209* (2013.01);
(Continued)

(58) Field of Classification Search
CPC .... F04D 27/007; F04D 27/004; F04D 29/522; H02K 11/21; H02K 11/30; H02K 5/04; H02K 7/14; H02K 21/22; H02K 2211/03; G05B 19/042; G05B 2219/23133; H05K 1/181; H05K 7/20209; H05K 7/20172; H05K 2201/1009; H05K 2201/10151; G06F 1/206
See application file for complete search history.

(56) References Cited

U.S. PATENT DOCUMENTS 6,565,334 B1 * 5/2003 Bradbury ............ F04D 29/384
417/244
6,612,817 B2 * 9/2003 Lin ....................... F04D 29/522
415/199.5
(Continued)

FOREIGN PATENT DOCUMENTS

CN 102999133 A 3/2013
CN 203230610 U 10/2013
(Continued)

OTHER PUBLICATIONS

Bie, Z. The gravity sensing control fan, 2015, CN-205349814-U (Year: 2015).*
(Continued)

*Primary Examiner* — Michael A Matey
(74) *Attorney, Agent, or Firm* — Demian K. Jackson; Jackson IPG PLLC (57) ABSTRACT

The present invention is a fan having rotation sensing, comprising a casing, a motor disposed within the casing, a rotation sensing unit, and a control unit, the rotation sensing unit detecting a first rotation of the casing and outputting a first sensing signal, the control unit having a controller electrically coupled to the rotation sensing unit and the motor, the controller receiving the first sensing signal according thereto to control the motor to perform a first operation mode. Through this design, an operation mode of the fan can be adjusted according to the rotation of the fan in the present invention.

10 Claims, 5 Drawing Sheets

(51) Int. Cl.
  *H02K 7/14*     (2006.01)
  *H02K 11/21*    (2016.01)
  *H02K 11/30*    (2016.01)
  *H02K 21/22*    (2006.01)
  *H05K 1/18*     (2006.01)
  *H05K 7/20*     (2006.01)
  *G05B 19/042*   (2006.01)
  *F04D 29/52*    (2006.01)
  *G06F 1/20*     (2006.01)

(52) U.S. Cl.
  CPC .... *G05B 2219/23133* (2013.01); *G06F 1/206* (2013.01); *H02K 2211/03* (2013.01); *H05K 7/20172* (2013.01); *H05K 2201/1009* (2013.01); *H05K 2201/10151* (2013.01)

(56) References Cited

U.S. PATENT DOCUMENTS

| | | | | |
|---|---|---|---|---|
| 8,684,708 | B2 * | 4/2014 | Ou | F04D 25/0693 417/423.7 |
| 2006/0262499 | A1 * | 11/2006 | Vinson | G06F 1/20 361/679.48 |
| 2007/0020085 | A1 * | 1/2007 | Takemoto | F04D 17/162 415/93 |
| 2007/0217149 | A1 * | 9/2007 | Horng | F04D 29/582 361/695 |
| 2010/0316514 | A1 * | 12/2010 | Horng | H02K 3/47 417/422 |
| 2012/0219399 | A1 * | 8/2012 | Suzuki | F04D 25/06 415/1 |
| 2013/0081779 | A1 * | 4/2013 | Liao | G05D 23/19 165/11.1 |
| 2014/0111935 | A1 * | 4/2014 | Ito | G06F 1/203 361/679.48 |
| 2014/0246996 | A1 * | 9/2014 | Wu | H02P 6/30 318/293 |
| 2016/0102672 | A1 * | 4/2016 | Liu | F16C 32/0427 417/423.12 |
| 2019/0307017 | A1 * | 10/2019 | Kaidu | H02P 29/68 |
| 2020/0282881 | A1 * | 9/2020 | Kim | B60N 2/5657 |

FOREIGN PATENT DOCUMENTS

| | | | |
|---|---|---|---|
| CN | 103853300 | A | 6/2014 |
| CN | 104452170 | A | 3/2015 |
| CN | 205349814 | U * | 6/2016 |
| CN | 205349814 | U | 6/2016 |
| CN | 210484126 | U | 5/2020 |
| TW | M351277 | | 2/2009 |
| TW | 201642571 | A | 12/2016 |
| TW | 201928581 | A | 7/2019 |
| TW | M586012 | | 11/2019 |

OTHER PUBLICATIONS

Search Report dated Feb. 4, 2020 issued by Taiwan Intellectual Property Office for counterpart application No. 108126203.
Search Report dated Oct. 13, 2020 issued by Taiwan Intellectual Property Office for counterpart application No. 108126203.
Search Report dated May 29, 2020 issued by China National Intellectual Property Administration for counterpart application No. 2019106724796.

* cited by examiner

FIG. 4

FAN HAVING ROTATION SENSING

BACKGROUND OF THE INVENTION

1. Field of the Invention

The present invention relates to a fan having rotation sensing, and specifically to a fan having rotation sensing that adjusts an operation mode of the fan according to the rotation of the fan.

2. Description of the Related Art

A cooling fan is mostly disposed within a common electronic device, such as a server, personal desktop computer, all-in-one computer, laptop computer, or monitor. Therefore, the heat generated during the operation of the electronic device can be dissipated to the surroundings through the airflow generated by the cooling fan. However, one conventional cooling fan can only have one single operating function in its use, i.e., the fan can only have one ability to increase or decrease the rotational speed thereof, or one ability to rotate in a clockwise or counterclockwise direction. When a user is in need of the two abilities of changing the rotational speed and rotating in a clockwise or counterclockwise direction, he/she has to buy two fans with two different functions, respectively and to install them separately, which causes inconvenience in use and increases the cost. In addition, for the reason of making a electronic device (such as a laptop, computer, tablet, smart portable device, or smart watch) thinner, the space inside the device is limited and unable to install two fans with two different functions, so the user has to choose between the different functions, i.e., selecting one function than the other (increasing or decreasing the rotational speed rather than rotating in a clockwise or counterclockwise direction, or rotating in a clockwise or counterclockwise direction rather than increasing or decreasing the rotational speed).

Although a cooling fan with two different functions has been delivered in this field for dealing with the above-mentioned issue, another issue came in. The issue occurs when a user tries to switch from the rotational speed changing function to the direction changing function (such as clockwise direction), the switching requires complex and lengthy steps, and a user with professional skills to conduct the switching. More specifically, it takes a long period of time for the professional user to input a new instruction (e.q., an instruction for clockwise rotation) through an external computer connecting to the cooling fan, and the instruction has to be checked in trials before turning the fan in a clockwise direction. Another instruction is required to be input if the user wants to switch back to the rotational speed changing function. Furthermore, most users do not know how to input the instructions to the fan to switch between the functions Therefore, this kind of fan has problems of being inconvenient in its use, being unable to switch between functions thereof in real time, and experiencing a long period of time of switching the functions.

SUMMARY OF THE INVENTION

One purpose of the present invention is to provides a fan having rotation sensing that adjusts an operation mode of the fan according to the rotation of the fan.

Another purpose of the present invention is to provide a fan having rotation sensing that can switch the operation mode thereof in real time in order to save the switching time between different functions effectively and to improve operational convenience.

To achieve above-mentioned purposes, the present invention is provided with a fan having rotation sensing, comprising a casing, a motor, an rotation sensing unit, and a control unit, the motor disposed within the casing, the rotation sensing unit detecting a first rotation angle of the casing and outputting a first sensing signal, the control unit having a controller electrically coupled to the rotation sensing unit and the motor, the controller receiving the first sensing signal according thereto to control the motor to perform a first operation mode. Through the design of a fan having rotation sensing of the present invention, an operation mode of the fan can be adjusted according to the rotation of the fan, the switching time between different functions can be saved effectively, operational convenience can thus be improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The above-mentioned purposes, and the structure and functions of the present invention are to be illustrated with reference to the preferred embodiments in the accompanying drawings.

Figure 1:
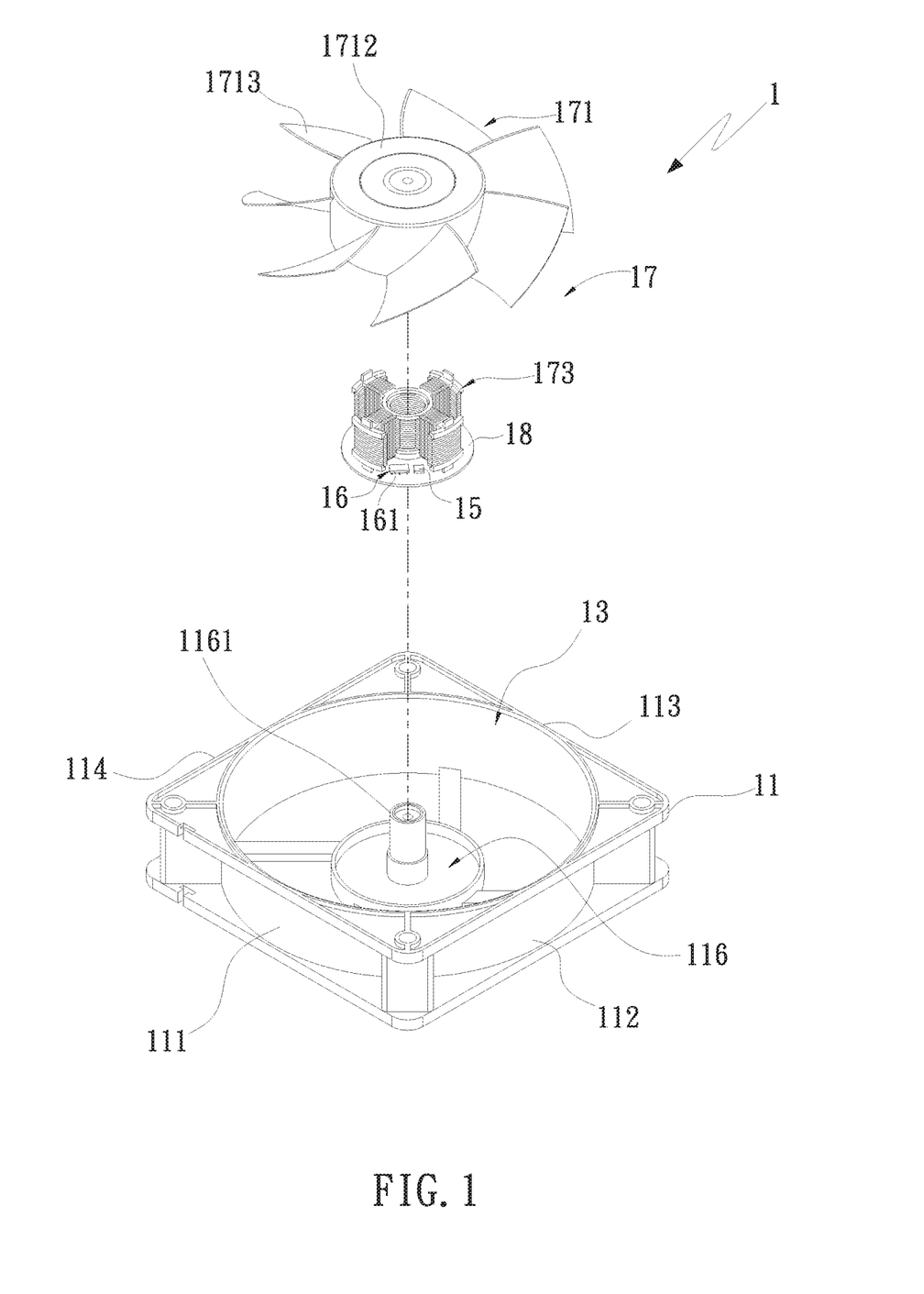
FIG. 1 is a exploded perspective view of an embodiment of the present invention.
Figure 2:
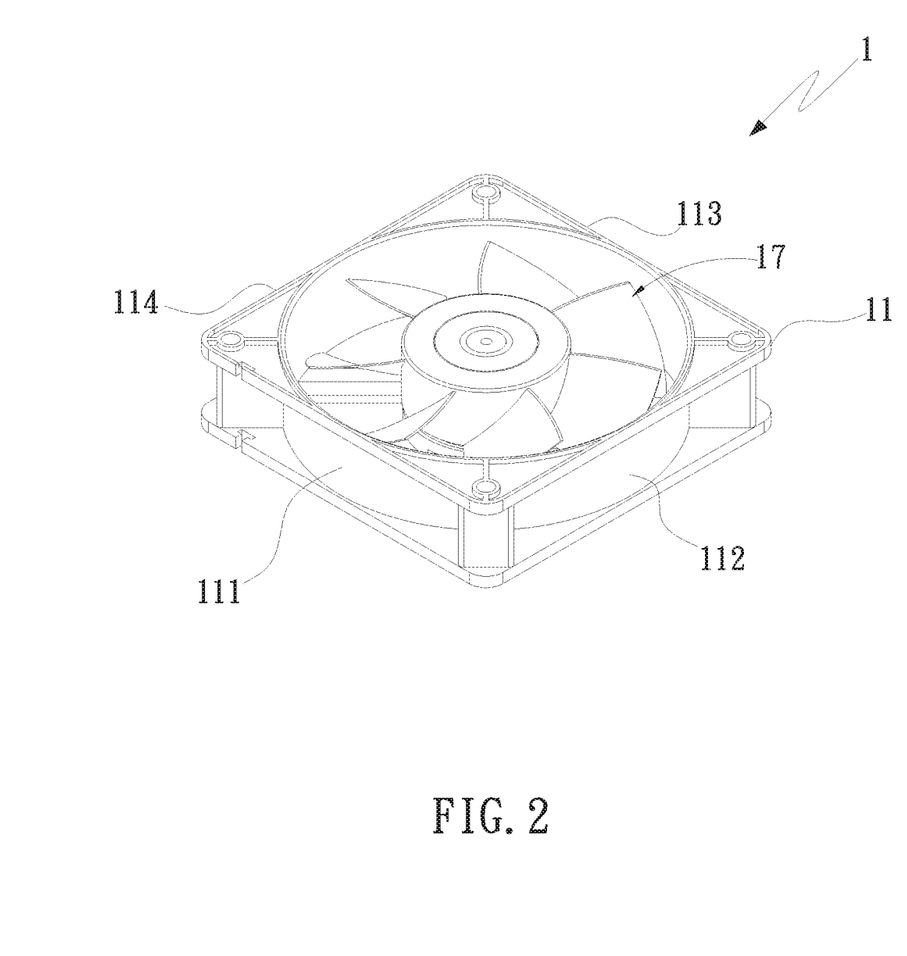
FIG. 2 is a perspective view of the embodiment of the present invention.
Figure 2A:
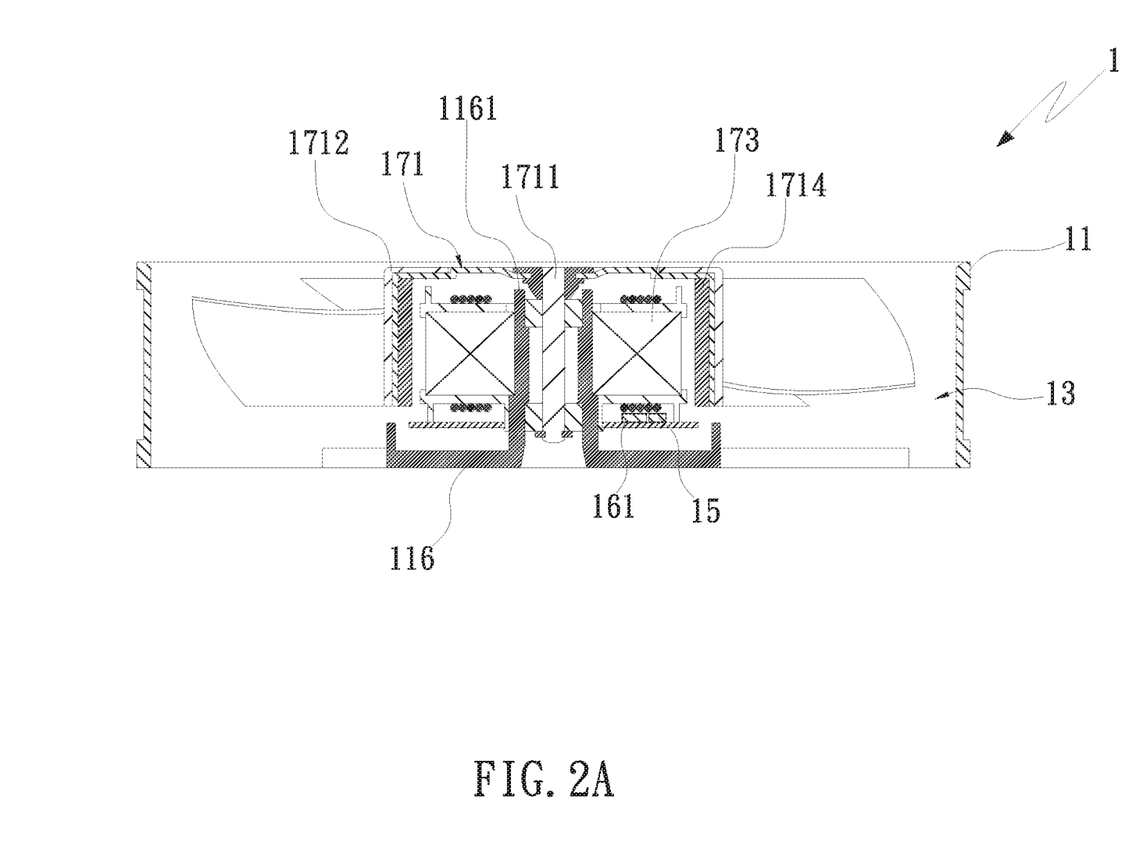
FIG. 2A is a side cross-sectional view of the embodiment of the present invention.
Figure 3:
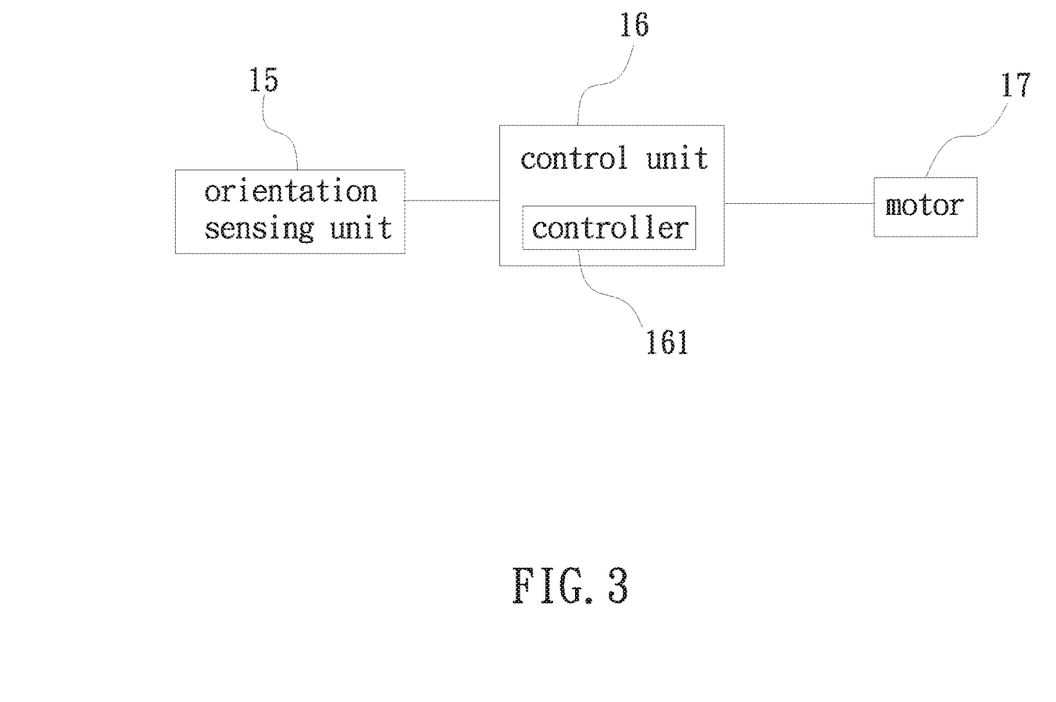
FIG. 3 is a block diagram of the embodiment of the present invention.
Figure 4:
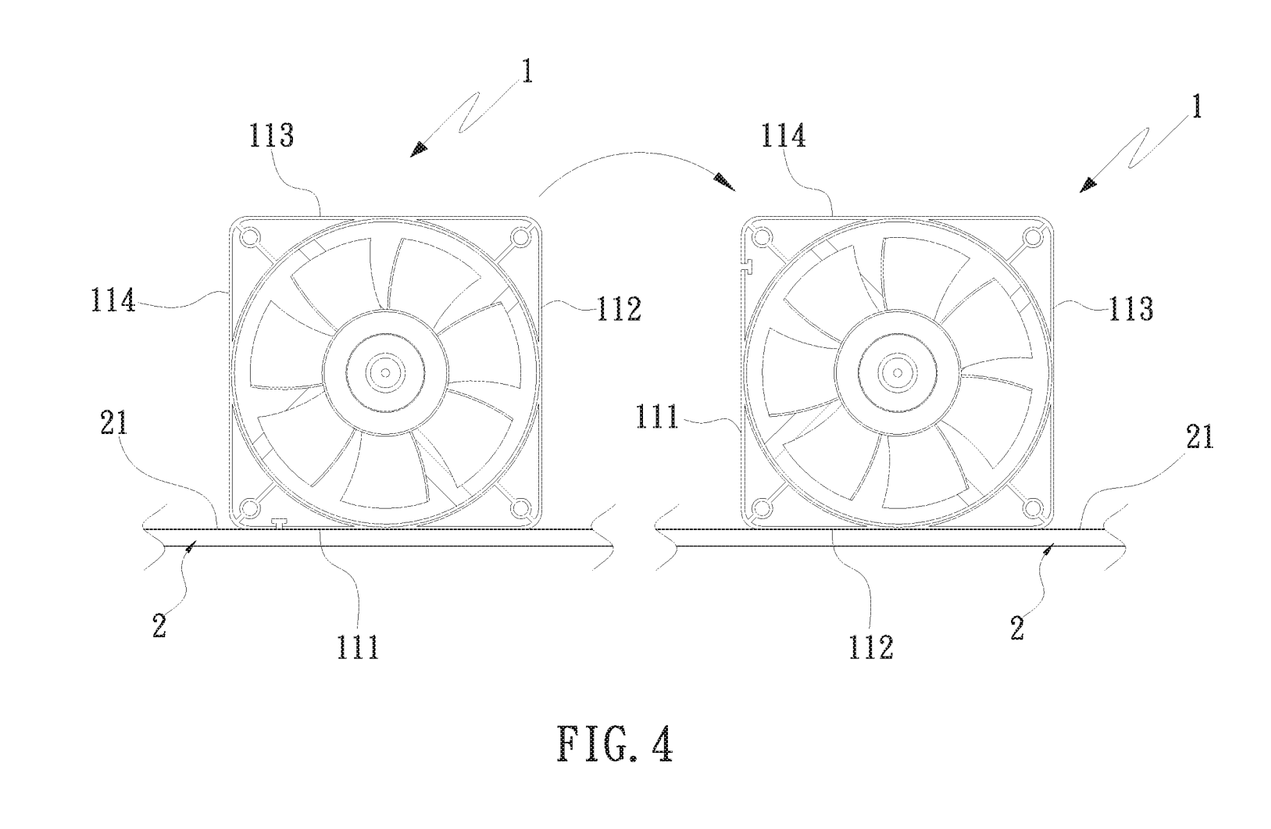
FIG. 4 is an embodiment diagram illustrating turning one mounting surface to another mounting surface of a fan.

The present invention is provided with a fan having rotation sensing with reference to FIG. 1 being a exploded perspective view of an embodiment of the present invention, FIG. 2 being a perspective view of the embodiment of the present invention, FIG. 2A being a side cross-sectional view of the embodiment of the present invention, FIG. 3 being a block diagram of the embodiment of the present invention, and FIG. 4 being an embodiment diagram illustrating turning one mounting surface to another mounting surface of a fan. As illustrated, a fan 1 is embodied but not limited as an axial fan in this embodiment, and, in other embodiments, may be embodied as other fans (such as, a centrifugal fan, forced draft fan, or fans connected in series). The fan 1 includes a casing 11, motor 17, rotation sensing unit 15, and control unit 16. The casing 11 is generally embodied as a rectangular shape that has a first mounting surface 111, a second mounting surface 112, a third mounting surface 113 opposing to the first mounting surface, a fourth mounting surface 114 opposing to the second mounting surface 112, a space 13, and a shaft mount 116. The first, second, third, and fourth mounting surfaces 111, 112, 113, and 114 are defined by the four sides of the casing 11, respectively. Each of the mounting surfaces (i.e., The first, second, third, and fourth mounting surfaces 111, 112, 113, and 114) defines a different function (or an operation mode) of the fan 1, orients the fan 1, and achieves foolproof in mounting the fan 1. The shaft mount 116 is contained within the space 13, and is located on the bottom of the casing 11 connecting thereto. The shaft mount 116 is used for pivotally connecting to a shaft 1711 in the motor 17. A circuit board 18 (e.g., a flexible printed circuit board or rigid printed circuit board) having a plurality of electronic components is disposed on the shaft mount 116, and is electrically connected to the motor 17. In addition, the mounting surfaces of the casing 11 is not limited to the above-mentioned four mounting surfaces, other numbers of the mounting surfaces can also be implemented in other embodiments. The number of the mounting surfaces is dependent on the number of the functions (or operation modes) associated with the fan 1, and is dependent on the shape of the fan 1.

One of the first, second, third, and fourth mounting surfaces 111, 112, 113, and 114 attaches to a contact surface 21 (e.q., the surface of an electronic device, server, or communication equipment) of a device 2 (e.q., an electronic device, server, or communication equipment). The motor 17 is disposed within the space 13 of the casing 11, and is provided with a stator 173 and a rotor 171 that has a fan wheel 1712 constructed by a plurality of blades 1713, a magnetic component 1714, and said shaft 1711. One end of the shaft 1711 is fixed to the fan wheel 1712, and the other end of the shaft 1711 is pivotally connected to the inside of a shaft sleeve 1161. The stator 173 is disposed on the shaft mount 116 and around the shaft sleeve 1161, and interacts with the magnetic component 1714 inside the fan wheel 1712.

The rotation sensing unit 15 is embodied as an angular position sensor that detects an rotation of the casing 11 and outputs a sensing signal. For example, the rotation sensing unit 15 detects a first rotation of the casing 11 and outputs a first sensing signal, the rotation sensing unit 15 detects a second rotation of the casing 11 and outputs a second sensing signal, the rotation sensing unit 15 detects a third rotation of the casing 11 and outputs a third sensing signal, and the rotation sensing unit 15 detects a fourth rotation of the casing 11 and outputs a fourth sensing signal. The first rotation of the casing 11 is a predefined rotation that is detected the angle rotation from the position of any of the second, third, or fourth mounting surfaces 112, 113 or 114 to the position of the first mounting surface 111; the second rotation of the casing 11 is a predefined rotation that is detected the angle rotation from the position of any of the first, third, or fourth mounting surfaces 111, 113, or 114 to the position of the second mounting surface 112; the third rotation of the casing 11 is a predefined rotation that is detected the angle rotation from the position of any of the first, second, or fourth mounting surfaces 111, 112, or 114 to the position of the third mounting surface 113; and the fourth rotation angle of the casing 11 is a predefined rotation that is detected the angle rotation from the position of any of the first, second, or third mounting surfaces 111, 112, or 113 to the position of the fourth mounting surface 114.

In other embodiments, the rotation sensing unit 15 may be embodied as an acceleration sensor, gyroscope, G-sensor, or any combination thereof. The control unit has a controller 161, which is embodied as a microcontroller unit (MCU) in this embodiment, and is electrically connected to the rotation sensing unit 15 and the motor 17. The controller 161 and the rotation sensing unit 15 in this embodiment are disposed on and electrically connected to the circuit board 18. The controller 161 decides which operation mode (or function) the motor 17 performs based on a sensing signal output by the rotation sensing unit 15 in detection of the rotation of the casing 11. In other embodiments, the controller 161 may be embodied as a CPU, system on a chip (SOC), digital signal processor (DSP). In another embodiment, the rotation sensing unit 15 may be disposed on the casing 11 (such as, the shaft mount 116), and is electrically connected to the controller 161 on the circuit board 18 via a signal cable. In addition, in implementation of this embodiment, the control unit 16 on the circuit board 18, other than the controller 161, includes other related circuits (such as PWM circuit, hall effect sensor circuit, switch circuit, stabilizer circuit, and signal output circuit, which are not shown in the figures) that are electrically connected to the controller 161.

An example described below shows how the motor 17 of the fan 1 performs different types of functions (e.q., four functions).

In the example, a first operation mode is set to be a counterclockwise rotation mode. When the casing 11 is turned to the first rotation, and the first mounting surface 111 attaches to the contact surface 21 of the device 2, the rotation sensing unit 15 detects the first rotation of the casing 11 and outputs the first sensing signal, and the controller 161 of the control unit 16 receives the first sensing signal according thereto to control the motor 17 to perform the first operation mode, i.e., the controller 161 controls the fan 1 to rotate in a counterclockwise direction.

In the example, a second operation mode is set to be a voltage-controlled rotational speed mode. When the casing 11 is turned to the second rotation, and the second mounting surface 112 attaches to the contact surface 21 of the device 2, the rotation sensing unit 15 detects the second rotation of the casing 11 and outputs the second sensing signal, and the controller 161 of the control unit 16 receives the second sensing signal according thereto to control the motor 17 to perform the second operation mode, i.e., the controller 161 controls the rotational speed of the fan 1 by way of voltage.

In the example, a third operation mode is set to be a PWM-controlled rotational speed mode. When the casing 11 is turned to the third rotation, and the third mounting surface 113 attaches to the contact surface 21 of the device 2, the rotation sensing unit 15 detects the third rotation of the casing 11 and outputs the third sensing signal, and the controller 161 of the control unit 16 receives the third sensing signal according thereto to control the motor 17 to perform the third operation mode, i.e., the controller 161 controls the rotational speed of the fan 1 by way of PWM signals.

In the example, a fourth operation mode is set to be a temperature-controlled rotational speed mode. When the casing 11 is turned to the fourth rotation, and the fourth mounting surface 114 attaches to the contact surface 21 of the device 2, the rotation sensing unit 15 detects the fourth rotation of the casing 11 and outputs the fourth sensing signal, and the controller 161 of the control unit 16 receives the fourth sensing signal according thereto to control the motor 17 to perform the fourth operation mode, i.e., the controller 161 controls the rotational speed of the fan 1 by way of temperature.

However, in implementation of the present invention, the operation modes of the fan 1 are not limited to the above-mentioned four functions, other operation modes may be implemented according to the functions, convenience, and flexibility of a product that are required by a user. Furthermore, the fan 1 may have one or more operation modes, such as rotation, halt, rotational speed increasing or decreasing, clockwise or counterclockwise rotation, timed activation or deactivation, sleep mode, etc., each of which corresponds to a mounting surface of the fan 1 in an rotation which can be detected by the rotation sensing unit 15. Accordingly, the flexibility of the functions of the fan 1 based on an rotation of the mounting surface, and the flexibility of the mounting of the fan 1 by a user based on his/her demands can thus be achieved.

As illustrated in FIG. 4, when the fan 1 installed in the electronic device (i.e., the device 2) is needed to be switched from the running operation mode to another operation mode (e.q., from a first operation mode to a second operation mode), a user can pick up the fan 1 attaching to the contact surface 21 with its first mounting surface 111 directly and turn the fan 1 making the second mounting 112 to attach to the contact surface 21 of the electronic device. At the same time, the controller 161 controls the motor 17 to switch from the first operation mode (such as, a counterclockwise rotation mode) to the second operation mode (such as, a voltage-controlled rotational speed mode). The switching between other operation modes is the same. In addition, the controller 161 compares the sensing signal output by the rotation sensing unit 15 based on the rotation of the casing 11 with predefined rotation data (such as, the first to fourth predefined rotation data of the casing). If the sensing signal does not match with the rotation data, the controller 161 control the motor 17 not to activate, and if the sensing signal matches with one of the rotation data, the controller 161 controls the motor 17 to perform an operation mode corresponding to the rotation data. That is, the fan 1 is not activated if in a wrong rotation, foolproof in mounting the fan 1 can thus be achieved.

Therefore, through the design of the fan 1 having rotation sensing of the present invention, a user, based on demands, can switch between the operation modes of the fan 1 flexibly and in real time by adjusting the rotation of the fan 1. Furthermore, the switching time between different operation modes of the fan 1 can be saved effectively, operational convenience in use can thus be improved.

What is claimed is:

1. A fan having rotation sensing comprising:
a casing having a first mounting surface, a second mounting surface, a third mounting surface, a fourth mounting surface, a space, and a shaft mount contained within the space, wherein the first, second, third, and fourth mounting surfaces are defined by four sides of the casing, respectively;
a motor disposed within the casing and having a shaft pivotally connected to the shaft mount;
a rotation sensing unit configured to detect a first rotational position of the casing with respect to a contact surface of an electronic device and to correspondingly output a first sensing signal; and
a control unit having a controller electrically coupled to the rotation sensing unit and the motor, the controller receiving the first sensing signal according thereto to control the motor to perform a first operation mode selected from the group of operation modes consisting of clockwise rotation mode counterclockwise rotation mode, voltage-controlled rotational speed mode, PWM-controlled rotational speed mode, temperature-controlled rotational speed mode, halt, rotational speed increasing, rotational speed decreasing, timed activation, timed deactivation, and sleep mode.

2. The fan having rotation sensing according to claim 1, wherein the rotation sensing unit detects a second rotational position of the casing and outputs a second sensing signal, and wherein the controller receives the second sensing signal according thereto to control the motor to perform a second operation mode.

3. The fan having rotation sensing according to claim 2, wherein the rotation sensing unit detects a third rotational position of the casing and outputs a third sensing signal, and wherein the controller receives the third sensing signal according thereto to control the motor to perform a third operation mode.

4. The fan having rotation sensing according to claim 3, wherein the rotation sensing unit detects a fourth rotational position of the casing and outputs a fourth sensing signal, and wherein the controller receives the fourth sensing signal according thereto to control the motor to perform a fourth operation mode.

5. The fan having rotation sensing according to claim 1, wherein one of the first, second, third, and fourth mounting surfaces attaches to the contact surface of the electronic device; wherein, when the casing is turned to the first rotational position, the first mounting surface attaches to the contact surface of the device, the rotation sensing unit detects the first rotational position and outputs the first sensing signal, and the controller of the control unit receives the first sensing signal according thereto to control the motor to perform the first operation mode; and wherein when the casing is turned to a second rotational position, and the second mounting surface attaches to the contact surface of the device, the rotation sensing unit detects the second rotational position and outputs a second sensing signal, and the controller of the control unit receives the second sensing signal according thereto to control the motor to perform a second operation mode.

6. The fan having rotation sensing according to claim 5, wherein when the casing is turned to a third rotational position, and the third mounting surface attaches to the contact surface of the device, the rotation sensing unit detects the third rotational position and outputs a third sensing signal, and the controller of the control unit receives the third sensing signal according thereto to control the motor to perform a third operation mode; and wherein when the casing is turned to a fourth rotational position, and the fourth mounting surface attaches to the contact surface of the device, the rotation sensing unit detects the fourth rotational position and outputs a fourth sensing signal, and the controller of the control unit receives the fourth sensing signal according thereto to control the motor to perform a fourth operation mode.

7. The fan having rotation sensing according to claim 1, wherein the controller is a microcontroller unit, CPU, or digital signal processor.

8. The fan having rotation sensing according to claim 2, wherein the rotation sensing unit is an angular velocity sensor, acceleration sensor, gyroscope, G-sensor, or any combination thereof.

9. The fan having rotation sensing according to claim 1, wherein the motor is disposed within the space of the casing, and is provided with a stator and a rotor; wherein the stator is disposed on the shaft mount and around a shaft sleeve; wherein the rotor has the shaft and a fan wheel constructed by a plurality of blades; and wherein the shaft is fixed to the fan wheel with its one end and is pivotally connected to the inside of the shaft sleeve with the other end.

10. The fan having rotation sensing according to claim 1, wherein a circuit board is disposed on the shaft mount, wherein the controller and the rotation sensing unit are disposed on and electrically connected to the circuit board, and wherein the motor is electrically connected to the circuit board.

* * * * *